United States Patent [19]

Sawada et al.

[11] Patent Number: 5,475,256
[45] Date of Patent: Dec. 12, 1995

[54] OPTO-ELECTRONIC INTEGRATED CIRCUIT

[75] Inventors: Sosaku Sawada; Goro Sasaki; Hiroshi Yano, all of Yokohama, Japan

[73] Assignee: Sumitomo Electric Industries, Ltd., Japan

[21] Appl. No.: 235,947

[22] Filed: May 2, 1994

[30] Foreign Application Priority Data

May 17, 1993 [JP] Japan ..................................... 5-115005

[51] Int. Cl.⁶ .................................................. H01L 27/01
[52] U.S. Cl. .......................... 257/577; 257/186; 257/197; 257/458; 257/615
[58] Field of Search ..................................... 257/577, 186, 257/197, 458, 615

[56] References Cited

U.S. PATENT DOCUMENTS 5,063,426 11/1991 Chandrasekhar et al. ................ 357/30

OTHER PUBLICATIONS

"A Monolithic 5 GB/s p–i–n/HBT Integrated Photoreceiver Circuit Realized from Chemical Beam Epitaxial Material," pp. 823–825, *IEEE Photonics Technology Letters*, vol. 3, No. 9, Sep. 1991.
"A 10 Gbit/s Oeic Photoreceiver Using INp/InGaAs Heterojunction Bipolar Transistors," pp. 466–468, *Electronics Letters* 27th Feb. 1992, vol. 28, No. 5.
"Receiver Design for High–Speed Optical–Fiber Systems," pp. 243–267, *Journal of Lightwave Technology*, vol. LT–2, No. 3, Jun. 1984.
"Speed and Sensitivity Limitations of Optoelectronic Receivers Based on MSM Photodiode and Millimeter–Wave HBT'S on INP Substrate," pp. 1145–1148, *Ieee Photonics Technology Letters*, vol. 4, No. 10, Oct. 1992.
"Effect of Hot–Electron Injection on High–Frequency Characteristics of Abrut $In_{0.52}(GA_{1-x}-AL_x)_{0.48}AS/INGaAs$ HBT'S," pp. 500–506, *Ieee Photonics Technology Letters*, vol. 39, No. 3, Mar. 1992.
Patent Abstracts of Japan, vol. 12, No. 17 (E–574) 19 Jan. 1988 & JP–A–62 176 175 (Nippon Telegr & Teleph Corp).
Patent Abstracts of Japan, vol. 14, No. 22 (E–874) 17 Jan. 1990 & JP–A–01 262 663 (Fujitsu Ltd.).
Patent Abstracts of Japan, vol. 13, No. 525 (E–850) 22 Nov. 1989 & J–A–01 214 159 (Fujitsu Ltd.).

*Primary Examiner*—Mark V. Prenty
*Attorney, Agent, or Firm*—Beveridge, DeGrandi, Weilacher & Young

[57] ABSTRACT

An opto-electronic integrated circuit is arranged to comprise a photodetector and a tunnel emitter bipolar transistor for first-stage amplification of a current generated in the photodetector, as formed on a substrate. The tunnel emitter bipolar transistor can be operated at high speed and has a high amplification factor, so that noise due to the base current can be reduced upon amplification of the current generated in the photodetector by light detection.

13 Claims, 4 Drawing Sheets

Fig. 1

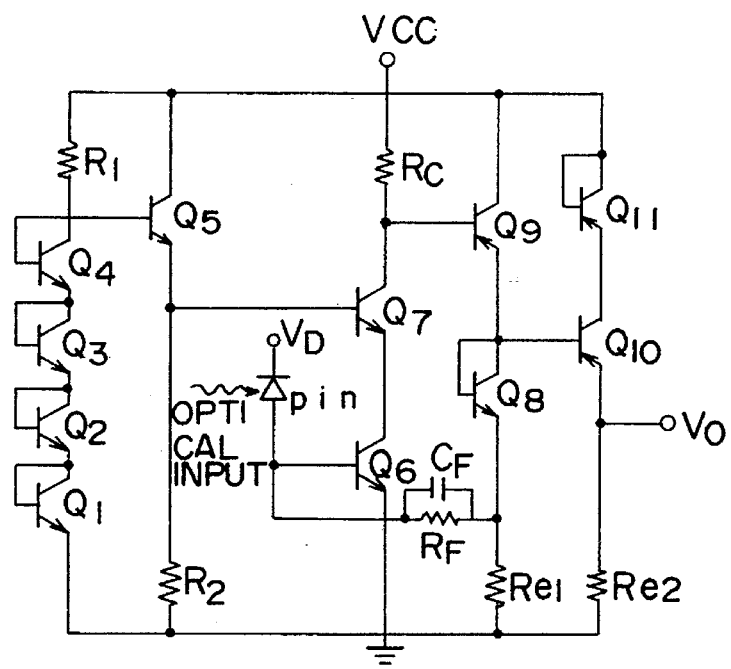

Fig. 2

| Device Layer | Material | Thickness(Å) | Doping (cm$^{-3}$) |
|---|---|---|---|
| Emitter Contact | n$^+$ : InGaAs | 2000 | $2 \times 10^{15}$ |
| Emitter Grading | n$^+$ : InP | 500 | $1 \times 10^{16}$ |
| Emitter | n : InP | 1500 | $5 \times 10^{18}$ |
| Set Back | n$^-$ : InGaAs | 50 | $2 \times 10^{18}$ |
| Base | p$^+$ : InGaAs | 500 | $4 \times 10^{19}$ |
| Collector | n$^-$ : InGaAs | 5000 | $5 \times 10^{15}$ |
| Subcollector | n$^+$ : InGaAs | 3000 | $1 \times 10^{18}$ |
| p-photodiode | p$^+$ : Inp | 4000 | $1 \times 10^{18}$ |
| i-photodiode | n$^-$ : InGaAs | 1 μm | $5 \times 10^{16}$ |
| n-photodiode | n$^+$ : InP | 4000 | $5 \times 10^{18}$ |
| Substrate | Fe : InP | — | Semi-Insulating |

5,475,256

OPTO-ELECTRONIC INTEGRATED CIRCUIT

BACKGROUND OF THE INVENTION

1. Field of the Invention

The present invention relates to an opto-electronic integrated circuit used, for example, in optical fiber communication, for receiving light and converting it into electric signals.

2. Related Background Art

With the development of optical fiber communication, optical receivers used in the field are required to have high-speed operability. In order to satisfy this requirement of high-speed operability and to achieve miniaturization, there have been studied and experimentally produced various opto-electronic integrated circuits composed of a combination of a photodetector and transistors. A typical example of such opto-electronic integrated circuits is one including a light receiving circuit composed of a pin photodiode and hetero-junction bipolar transistors as described in "S. Chandrasekhar, et al.: *IEEE Photon. Technol. Lett.*, Vol. 3, No. 9, 1991, pp. 823–825".

FIGS. 1 and 2 are structural drawings of the opto-electronic integrated circuit. FIG. 1 is a circuit structural drawing, and FIG. 2 is a table to indicate materials for forming the pin photodiode and hetero-junction bipolar transistors (hereinafter referred to as HBT). As shown, the opto-electronic integrated circuit is so arranged that the pin photodiode and HBT constituting a photodetector are formed, utilizing the hetero junction of InP and InGaAs, on a semi-insulating substrate made of an InP crystal. A chemical beam epitaxy process is used to form the hetero junction layer. The opto-electronic integrated circuit as so arranged is one for receiving light, having the characteristics of cut-off frequency ($f_T$)=32 GHz and maximum oscillation frequency ($f_{max}$)=28 GHz and being operable at 5 Gb/s for light of wavelength=1.5 μm.

Further, S. Chandrasekhar et al. gave a report on an opto-electronic integrated circuit for receiving light, having almost the same structure as that of the above opto-electronic integrated circuit, formed using the MOMBE process, and being operable at 10 Gb/s for light of wavelength=1.53 μm (S. Chandrasekhar, et al.: *Electronics Letters*, Vol. 28, 1992, pp. 466–468).

An equivalent input noise spectral density (N(f)) of opto-electronic integrated circuit can be expressed by the following formula (T. V. Muoi, IEEE/OSA Journal of Lightwave Technology, Vol. LT-2, No. 3, 1984, pp. 243–267:

$$N(f)=4kT/R_F+2eI_b+2eI_c(2\pi C_T)^2/g_m^2+4kTr_{bb'}(2\pi C_{dsf})^2 f^2 \quad (1)$$

where N(f): equivalent input noise spectral density;
f: frequency;
k: Boltzmann's constant;
T: absolute temperature;
$R_F$: feedback resistance;
e: elementary charge;
$I_b$: base current;
$I_c$: collector current;
$C_T$: total input capacitance;
$g_m$: current amplification factor of transistors;
$r_{bb'}$: base resistance;
$C_{dsf}$: a sum of photodetector capacitance, stray capacitance and feedback capacitance.

It is known that if first-stage amplification of a current generated in the photodetector with light input is performed by a common-emitter type amplifying circuit using HBT as described above, a noise component by the base current as expressed by the second term in above formula (1) becomes dominant in the equivalent input noise spectral density. Namely, the equivalent input noise spectral density can be approximately expressed by the following formula.

$$N(f) \sim 2eI_b \quad (2)$$

Accordingly, an amount of the noise component by the base current defines a limit to seeking high sensitivity.

SUMMARY OF THE INVENTION

It is an object of the present invention to provide a high-sensitive opto-electronic integrated circuit reduced in noise without victimizing the performance of operating speed as attainable in the conventional circuits.

An opto-electronic integrated circuit of the present invention is so arranged that there are formed in a monolithic manner on a semi-insulating substrate (a) a photodetector having a light absorbing portion made of a first semiconductor material, and (b) a tunnel emitter bipolar transistor (TEBT) comprising (1) a base portion made of a second semiconductor material having a first conduction type, (2) a tunnel barrier portion formed in contact with the base portion and made of a third semiconductor material, (3) an emitter portion formed on an opposite-side region of the tunnel barrier portion to the base portion and made of a fourth semiconductor material having a second conduction type, and (4) a collector portion formed on an opposite-side region of the base portion to the tunnel barrier portion and made of a fifth semiconductor material having the second conduction type.

The photodetector may be a pin photodiode, an avalanche photodiode or a metal-semiconductor-metal photodetector.

Also, a bandgap value of the third semiconductor material may be arranged as larger than those of the second semiconductor material and the fourth semiconductor material. The opto-electronic integrated circuit of this type may be so arranged (1) that the second semiconductor material is a GaInAs mixed crystal and the third semiconductor material is an InP crystal or (2) that the second semiconductor material is a GaInAs mixed crystal and the third semiconductor material is an AlInAs mixed crystal.

Also, the opto-electronic integrated circuit may be so arranged that a bandgap value of the first semiconductor material is larger than that of the second semiconductor material. In this case, the circuit may be so arranged (1) that the first semiconductor material is a GaInAsP mixed crystal, the second semiconductor material is a GaInAs mixed crystal, and the third semiconductor material is an InP crystal, or (2) that the first semiconductor material is a GaInAsP mixed crystal, the second semiconductor material is a GaInAs mixed crystal, and the third semiconductor material is an AlInAs mixed crystal.

Further, the circuit may be so arranged that it comprises a tunnel emitter bipolar transistor formed on the substrate by epitaxial layer growth and a pin photodiode formed by epitaxial growth successively conducted after the epitaxial layer growth for forming the tunnel emitter bipolar transistor, or may be so arranged that the thickness of the tunnel barrier portion made of the third material is not more than 200 Å.

In the opto-electronic integrated circuit of the present invention the photodetector generates a current when receiving external light and a change of the current is input as electric signals into the subsequent-stage circuit to be subjected to predetermined amplification and shaping and then to be output therefrom. When the current generated in the photodetector is amplified by a first transistor, noise components included in signal can be expressed by formula (2) as described above.

Incidentally, formula (2) can be reformed as follows:

$$N(f)-2eI_b=2eI_c/\beta \qquad (3)$$

where $\beta$: amplification factor of the first transistor.

This implies that an amount of generated noise can be decreased with larger $\beta$. If the operating speed performance is equivalent, the opto-electronic integrated circuit of the present invention can perform a higher-sensitivity operation while reducing the generated noise amount as compared with the conventional circuits, because $\beta$ of TEBT used in the present invention can be made larger than that of HBT in the conventional circuits.

Also, among the opto-electronic integrated circuits of the present invention, an opto-electronic integrated circuit in which the bandgap value of the light absorbing portion in the photodetector is set larger than that of the base portion in the TEBT has the following action in addition to the above action of the opto-electronic integrated circuits of the present invention. There is near the photodetector the TEBT in which a current flows in the base portion without detection of external light, so that radiative recombination could produce light according to the bandgap of the base portion. Even with irradiation of this light onto the light absorbing portion in the photodetector, the light will not be absorbed by the light absorbing portion, because the bandgap of the light absorbing portion in the photodetector is larger than that of the base portion in TEBT.

Also, with detection of external light, there is near the photodetector the TEBT in which a current flows in the base portion (for example, the first TEBT receiving an output from the photodetector), and the radiative recombination could produce light according to the bandgap of the base portion. Also in this case, with irradiation of this light onto the light absorbing portion in the photodetector, the light will not be absorbed by the light absorbing portion, because the bandgap of the light absorbing portion in the photodetector is larger than that of the base portion in HBT.

As described, the light absorbing portion in the photodetector absorbs only the external light as received, and the opto-electronic integrated circuit outputs an electric signal according to an amount of absorption of the light.

As described above, the opto-electronic integrated circuits of the present invention are so arranged that the tunnel emitter bi-polar transistor performs the first amplification for the current generated by the photodetector, which can improve the amplification factor and suppress the generated noise amount by the base current, as compared with the conventional hetero-junction bipolar transistor.

In addition to the above advantage, the opto-electronic integrated circuits of the present invention can enjoy the following advantage. In case the light absorbing portion in the photodetector is made of a material having a larger bandgap than a material for forming the base portion in TEBT, the light absorbing portion in the photodetector does not absorb the light due to the radiative recombination in the base portion as caused by the operation of TEBT, which can suppress the noise and which in turn permits a further higher-sensitivity opto-electronic integrated circuit to be achieved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 and FIG. 2 are explanatory illustrations for a conventional opto-electronic integrated circuit;

DESCRIPTION OF THE PREFERRED EMBODIMENTS

Figure 3:
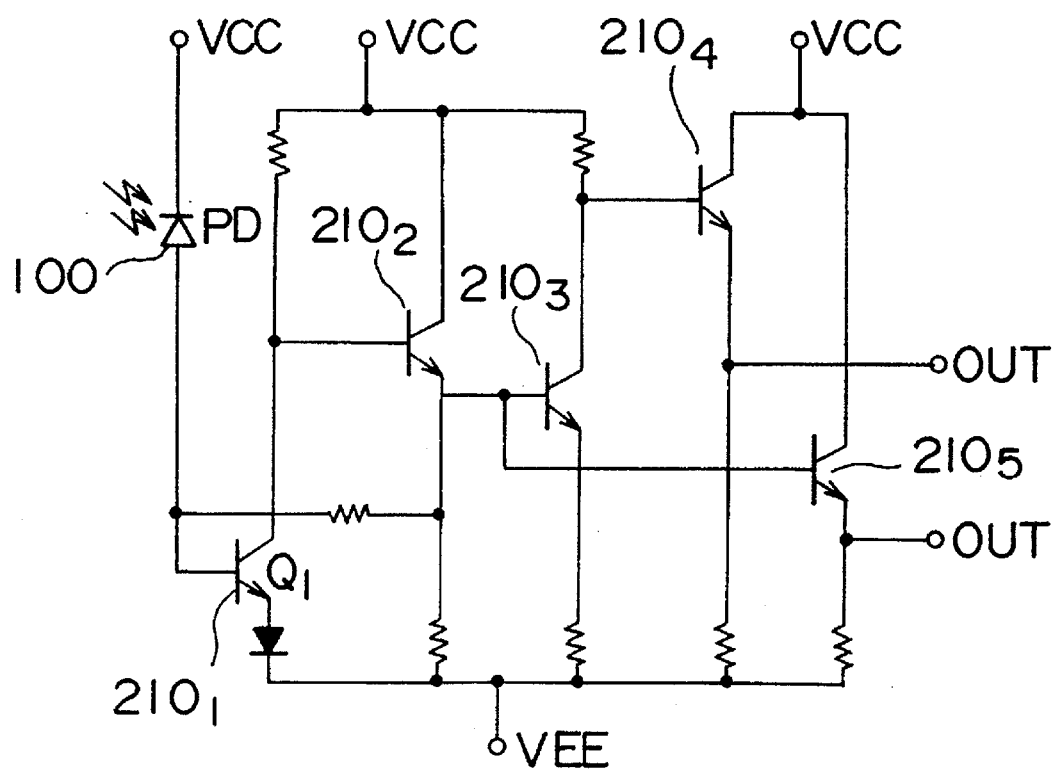
FIG. 3 is a circuit structural drawing to show an opto-electronic integrated circuit according to the first embodiment of the present invention.

Embodiments of the present invention will be described with reference to the accompanying drawings.

In the following description of the drawings, the same elements will be denoted by the same reference numerals and redundant description will be omitted.

First Embodiment

Figure 4:
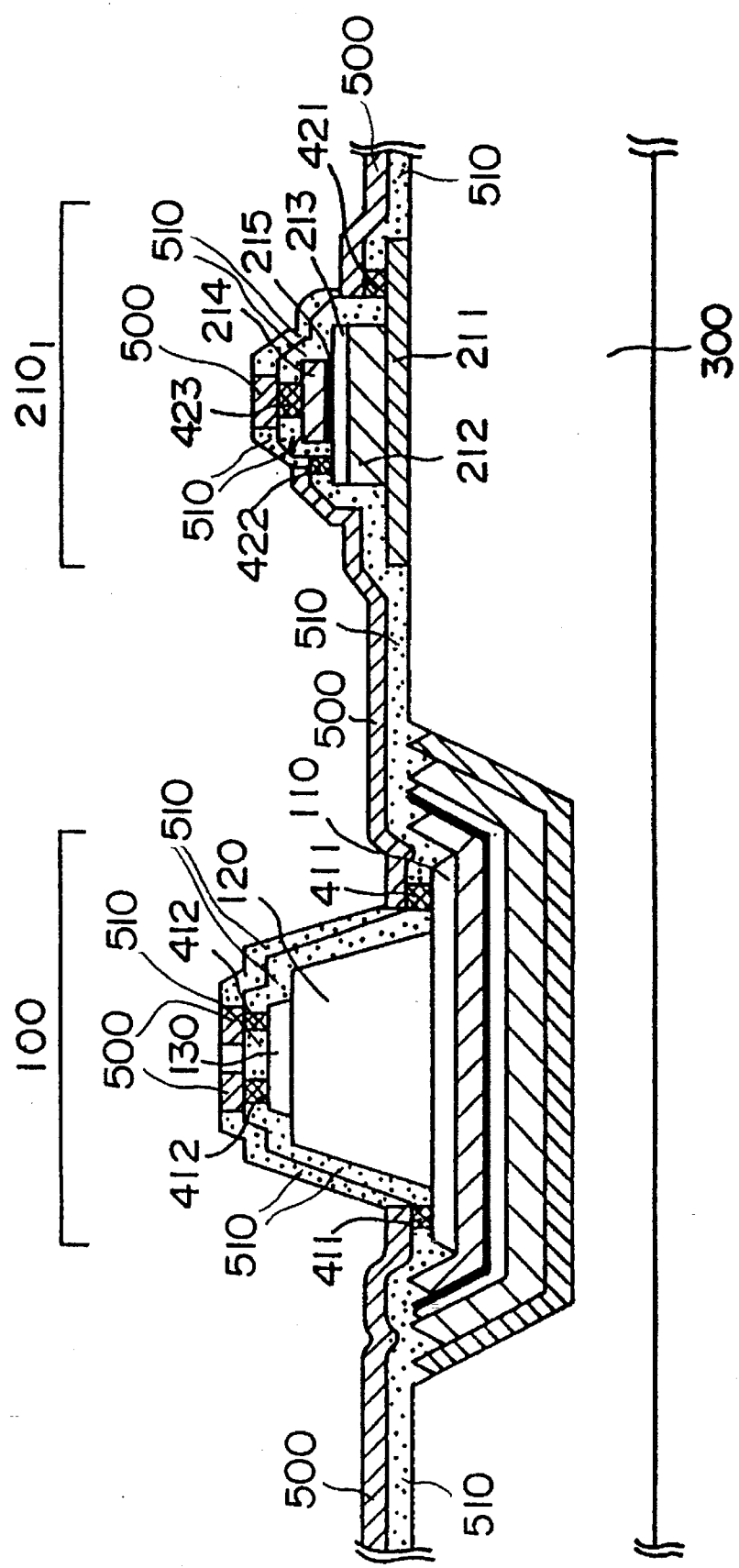
FIG. 4 is a drawing to show the structure of the opto-electronic integrated circuit according to the first embodiment of the present invention.

FIG. 3 is a circuit structural drawing of an opto-electronic integrated circuit in the first embodiment and FIG. 4 is a cross sectional structural drawing of a portion including a photodetector and a first TEBT. As shown in FIG. 3, this device is composed of a pin photodiode 100 showing the conductivity upon light detection, transistors of TEBT $210_1$–$210_5$ for receiving, amplifying and shaping an electric signal produced by a change of presence and absence of conductivity of the pin photodiode 100 upon application of a reverse bias voltage, and electrically passive elements such as resistors and capacitors for setting the operation conditions of TEBT $210_1$–$210_5$. This device outputs an electric signal according to an amount of external light incident into the pin photodiode 100.

Constituent elements of this device are formed on a semi-insulating substrate 300 made of an InP crystal (see FIG. 4). In FIG. 4, reference number 500 represents wiring, and reference number 510 represents insulative layers. The pin photodiode 100 has a trilayer structure composed of a cathode layer 110 formed above the substrate 300 and made of an InP crystal containing a high concentration of n-type impurity, a light absorbing layer 120 formed on the surface of the cathode layer 110 and made of a GaInAs mixed crystal containing a low content of impurity or substantially no impurity, and an anode layer 130 formed on the surface of the light absorbing layer 120 and made of a GaInAs crystal containing a high concentration of p-type impurity. Electrodes 411 and electrodes 412 are formed on portions of the surface of cathode layer 110 and on portions of the surface of the anode layer 130, respectively, and wiring 500 is arranged therefor.

TEBT $210_1$–$210_5$ have the same structure. This structure will be described with TEBT $210_1$ as representative, which receives at the base terminal thereof an output signal from the pin photodiode 100 as shown in FIG. 4 and which has a function to amplify the signal. TEBT $210_1$ has a five-layered structure composed of a subcollector layer 211 formed on the surface of the substrate 300 and made of a GaInAs mixed crystal containing a high concentration of n-type impurity, a collector layer 212 formed on the surface of the subcollector 211 and made of a GaInAs mixed crystal having the n-type conductivity, a base layer 213 formed on the surface of the collector layer 212 and made of a GaInAs mixed crystal having the p-type conductivity, a barrier layer 215 formed on the surface of the base layer 213 and made of an InP crystal, and an emitter layer 214 formed on the surface of the barrier layer 215 and made of a GaInAs mixed crystal containing a high concentration of n-type impurity. Electrodes 421, electrodes 422 and electrodes 423 are formed on the surface of subcollector layer 211, on the surface of base layer 213 and on the surface of emitter layer 214, respectively, and wiring 500 is arranged therefor.

The electrically passive elements include resistors and capacitors formed on the substrate by the ordinary method, which are connected by lines to the active elements including the pin photodiode 100 and the transistors 210 ($210_1$–$210_n$), as described above and which achieve the function of the device in cooperation with the active elements.

It should be noted that the pin photodiode 100 is not directly formed on the surface of substrate 300 in FIG. 4. This is because the present embodiment employs a method for forming the respective layers in the pin photodiode after layers of TEBT 210 are formed on the surface of substrate 300. The same operation and effect as in the present embodiment can be attained by direct formation of the pin photodiode on the surface of substrate 300.

A reverse bias voltage is applied to the pin photodiode 100, and the light absorbing layer 120 is depleted when no light is received. External light incident into the pin photodiode 100 is exponentially attenuated according to the light absorption coefficient while exciting photo carriers. The photo carriers produced in the depletion layer are accelerated by an electric field in the depletion layer to cause a current to flow from the anode layer 130 to the cathode layer 110. The light is also absorbed by the anode layer 130 and the cathode layer 110 to excite photo carriers. However, an excitation probability of photo carriers is low because these layers are thin. Further, movement of photo carriers depends upon diffusion. Therefore, an amount of generated current by the light absorption in these layers is very small as compared with an amount of generated current by the light absorption in the depletion layer.

The current thus generated with incident light is allowed to enter the amplification and shaping circuit composed of the transistors 210 and the electrically passive elements set in the subsequent stage, from which an electric signal according to a quantity of incident light is finally output.

Although the above embodiment is so arranged that the light absorbing layer in the pin photodiode is made of the same material of GaInAs mixed crystal as the base layer of TEBTs 210, the light absorbing layer may be made of a GaInAsP mixed crystal. In this case, a further higher-sensitivity opto-electronic integrated circuit can be attained because of the following reason. The base current flows in each TEBT upon the above amplification and shaping operation. Since the base layer 213 in each TEBT is made of the GaInAs mixed crystal, the base current causes the radiative recombination, which produces light of wavelength corresponding to the bandgap value of the base layer 213. This light could reach the light absorbing layer 120. Since the light absorbing layer 120 is made of the GaInAsP mixed crystal, the bandgap value thereof is larger than the bandgap value of the base layer 213. Thus, the light is not absorbed. Accordingly, the pin photodiode 100 produces a current faithful to a quantity of external light as received, which in turn permits an electric signal loyal to the quantity of received light to be obtained as an output from the opto-electronic integrated circuit.

Second Embodiment

Figure 5:
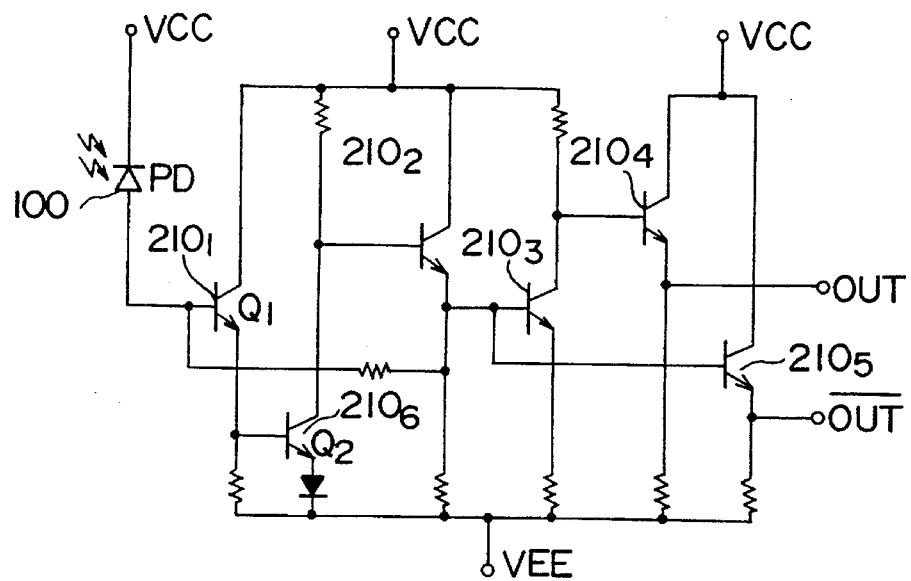
FIG. 5 is a circuit structural drawing to show an opto-electronic integrated circuit according to the second embodiment of the present invention.

FIG. 5 is a circuit structural drawing to show an opto-electronic integrated circuit according to the second embodiment of the present invention. The present embodiment is different from the first embodiment in that the first-stage amplification of the current generated in the pin photodiode 100 is performed by Darlington connection of TEBT $210_1$ and TEBT $210_6$ so as to enhance the application factor. Accordingly, β in formula (3) is substantially greater than that in the first embodiment, which can further reduce an amount of generated noise.

The opto-electronic integrated circuit of this embodiment has a structure similar to that of the first embodiment and operates qualitatively in the same manner as the first embodiment.

Third Embodiment

Figure 6:
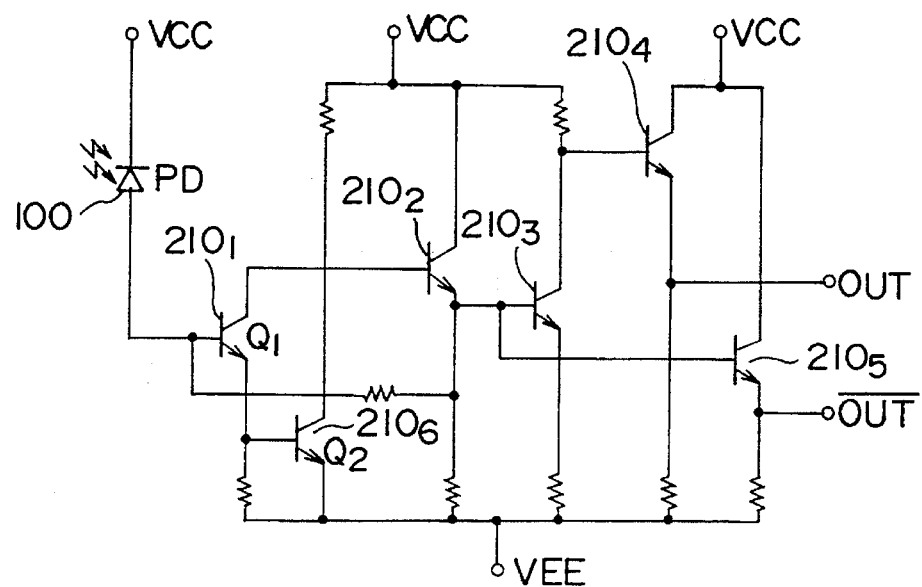
FIG. 6 is a circuit structural drawing to show an opto-electronic integrated circuit according to the third embodiment of the present invention.

FIG. 6 is a circuit structural drawing to show an opto-electronic integrated circuit according to the third embodiment of the present invention. The present embodiment is also different from the first embodiment in that the first-stage amplification of the current produced in the pin photodiode 100 is performed by Darlington connection of TEBT $210_1$ and TEBT $210_6$ so as to enhance the amplification factor, similarly as in the second embodiment. Also, the present embodiment is different from the second embodiment in that the emitter grounding of the Darlington-connected composite transistor is made without a diode. Accordingly, β in formula (3) is substantially greater than that in the first embodiment, similarly as in the second embodiment, which can further reduce the generated noise amount.

The opto-electronic integrated circuit of this embodiment has a structure similar to that of the first embodiment and operates qualitatively in the same manner as the first embodiment.

The present invention is not limited to the above embodiments, but may have various modifications. For example, the pin photodiode was used as the photodetector in the above embodiments, whereas a metal-semiconductor-metal photodetector or the like may be employed. Also, semiconductor materials other than those used in the above embodiments may be employed. For example, the gap layer may be made of an AlInAs mixed crystal.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An opto-electronic integrated circuit comprising:

a semi-insulating substrate;

a photodetector having a light receiving portion formed above said substrate and made of a first semiconductor material; and a tunnel emitter bipolar transistor formed above said substrate, said tunnel emitter bipolar transistor including a base portion made of a second semiconductor material having a first conduction type, a tunnel barrier portion formed in contact with said base portion and made of a third semiconductor material, an emitter portion formed in an opposite-side region of said tunnel barrier portion to said base portion and made of a fourth semiconductor material having a second conduction type, and a collector portion formed in an opposite-side region of said base portion to said tunnel barrier portion and made of a fifth semiconductor material having said second conduction type, wherein a bandgap value of said third semiconductor material is larger than those of said second semiconductor material and said fourth semiconductor material;

wherein said photodetector and said tunnel emitter bipolar transistor are formed in a monolithic manner.

2. An opto-electronic integrated circuit according to claim 1, wherein said photodetector is a pin photodiode.

3. An opto-electric integrated circuit comprising:

a semi-insulating substrate;

a photodetector having a light receiving portion formed above said substrate and made of a first semiconductor material, wherein said photodetector is an avalanche photodiode; and a tunnel emitter bipolar transistor formed above said substrate, said tunnel emitter bipolar transistor including a base portion made of a second semiconductor material having a first conduction type, a tunnel barrier portion formed in contact with said base portion and made of a third semiconductor material, an emitter portion formed in an opposite-side region of said tunnel barrier portion to said base portion and made of a fourth semiconductor material having a second conduction type, and a collector portion formed in an opposite-side region of said base portion to said tunnel barrier portion and made of a fifth semiconductor material having said second conduction type;

wherein said photodetector and said tunnel emitter bipolar transistor are formed in a monolithic manner.

4. An opto-electronic integrated circuit according to claim 1, wherein said second semiconductor material is a GaInAs mixed crystal and said third semiconductor material is an InP crystal.

5. An opto-electronic integrated circuit according to claim 1, wherein said second semiconductor material is a GaInAs mixed crystal and said third semiconductor material is an AlInAs mixed crystal.

6. An opto-electronic integrated circuit according to claim 2, wherein said tunnel emitter bipolar transistor is formed on said substrate by epitaxial layer growth, and wherein said pin photodiode is formed by epitaxial growth successively conducted after the epitaxial layer growth for forming said tunnel emitter bipolar transistor.

7. An opto-electronic integrated circuit according to claim 1, wherein a thickness of said tunnel barrier portion made of said third semiconductor material is not more than 200 angstroms.

8. An opto-electronic integrated circuit according to claim 1, wherein a bandgap value of said first semiconductor material is larger than that of said second semiconductor material.

9. An opto-electronic integrated circuit according to claim 8, wherein said first semiconductor material is a GaInAsP mixed crystal, said second semiconductor material is a GaInAs mixed material, and said third semiconductor material is an InP crystal.

10. An opto-electronic integrated circuit according to claim 8, wherein said first semiconductor material is a GaInAsP mixed crystal, said second semiconductor material is a GaInAs mixed material, and said third semiconductor material is an AlInAs mixed crystal.

11. An opto-electronic integrated circuit according to claim 8, wherein:

said photodetector is a pin photodiode; and said tunnel emitter bipolar transistor is formed on said substrate by epitaxial layer growth, and wherein said pin photodiode is formed by epitaxial growth successively conducted after the epitaxial layer growth for forming said tunnel emitter bipolar transistor.

12. An opto-electronic integrated circuit according to claim 1, wherein said photodetector is an avalanche photodiode.

13. An opto-electronic integrated circuit according to claim 1, wherein said photodetector is a metal-semiconductor-metal photodetector.

* * * * *